United States Patent [19]

Searle

[11] Patent Number: 4,743,871
[45] Date of Patent: May 10, 1988

[54] ADAPTIVE FILTER

[75] Inventor: Jeffrey Graham Searle, Stansted Mountfitchet, United Kingdom

[73] Assignee: STC PLC, London, England

[21] Appl. No.: 14,236

[22] Filed: Feb. 12, 1987

[30] Foreign Application Priority Data

Feb. 21, 1986 [GB] United Kingdom ............... 8604344

[51] Int. Cl.$^4$ ..................... H03H 15/00; H03H 21/00
[52] U.S. Cl. ...................................... 333/166; 333/12; 333/17 R; 333/174
[58] Field of Search ................. 333/18, 12, 17 R, 166, 333/167, 174; 328/165, 167; 364/724, 825

[56] References Cited

U.S. PATENT DOCUMENTS 3,568,107 3/1971 Haggarty ............................ 333/166
4,156,876 5/1979 Debuisser ....................... 333/166 X

FOREIGN PATENT DOCUMENTS 507417 6/1939 United Kingdom .
1568235 5/1980 United Kingdom .
2073553 10/1981 United Kingdom .
2118805 11/1983 United Kingdom .

Primary Examiner—Marvin L. Nussbaum
Attorney, Agent, or Firm—Lee, Smith & Zickert

[57] ABSTRACT

An adaptive filter may be realized by weighting the outputs from a tapped delay line. This, however, allows nulls to corrupt a wanted signal spectral region. A fixed (non-adaptive) filter (2) coupled between the signal input and an input of means (3) for summing the weighted outputs serves to allow nulls only to be formed in the skirt region of the fixed filter response thus preserving a wanted signal.

3 Claims, 2 Drawing Sheets

ADAPTIVE FILTER

BACKGROUND OF THE INVENTION

This invention relates to adaptive filters such as may be used in adaptive array signal processing arrangements.

Sinusoidal interference corrupting a signal is typically eliminated with a fixed notch filter turned to the frequency of the interference. A very narrow notch is usually desired in order to filter out the interference without distorting the signal. However, when the frequency of interference is unknown or drifts with time then the best solution is one which identifies the frequency or frequencies of interference and adapts one or more notches to cancel it. This may be achieved by means of an adaptive notch filter. In a broad RF band, any interfering carrier, modulated or unmodulated, can usually be considered to be narrow band, and an adaptive notch filter will be able to cancel it. However, the wanted signal is generally indistinguishable from the interference and will also be cancelled.

SUMMARY OF THE INVENTION

According to one aspect of the present invention there is provided an adaptive filter, for an input signal including a tapped delay line with weighted outputs, in combination with a non-adaptive filter, having pass band including a frequency of interest, disposed to prevent the formation of nulls at the frequency of interest.

According to another aspect of the present invention there is provided an adaptive filter, including a tapped delay line coupled to a signal input, means for weighting the outputs of the tapped delay line and means for summing the weighted outputs, in combination with a non-adaptive filter, coupled between the signal input and a respective input of the summing means, having a passband including a frequency of interest and serving to prevent the formation of nulls at the frequency of interest.

BRIEF DESCRIPTION OF THE DRAWINGS

Embodiments of the invention will now be described with reference to the accompanying drawings, in which.

DESCRIPTION OF THE PREFERRED EMBODIMENTS

Most receiver designs include a front end bandpass filter to remove interference from outside the working band. The nature of communication links requires that the strongest possible signals in the adjacent channels are filtered such that they cannot cause interference to the weakest receivable signals in the channel in use.

Adjacent channel interference can be removed in the intermediate frequency (IF) stage of a super heterodyne receiver effectively, but very strong interference can corrupt signals before the IF stage by forcing preamplifiers and other active components into limiting. The purpose of a front end bandpass filter is to increase the receiver's tolerance to strong "out of band" interference without affecting "in band", and potentially wanted, signals and it follows that the sharpest cut-off is desirable.

A sharp cut-off is commonly achieved with a multiple pole filter and due to the need for high "Q" sections this is constructed in large, metal resonant cavities, which are heavy, inconvenient and out of place in a solid state design. As the interference may be intermittent and is rarely present on more than a few frequencies, an adaptive filter that recognises the passband of the wanted signal rather than just cancelling it along with the unwanted signals is highly desirable.

A basic adaptive notch filter may be realised by weighting the outputs from a tapped delay line and summing the weighted outputs but, as mentioned above, this approach allows nulls in the filters frequency response to enter and corrupt the wanted spectral region.

When a reference for the interference is available it is known that it can be adaptively filtered to match the interfering signals as closely as possible, allowing them to be subtracted out to leave the wanted signals.

Figure 1:
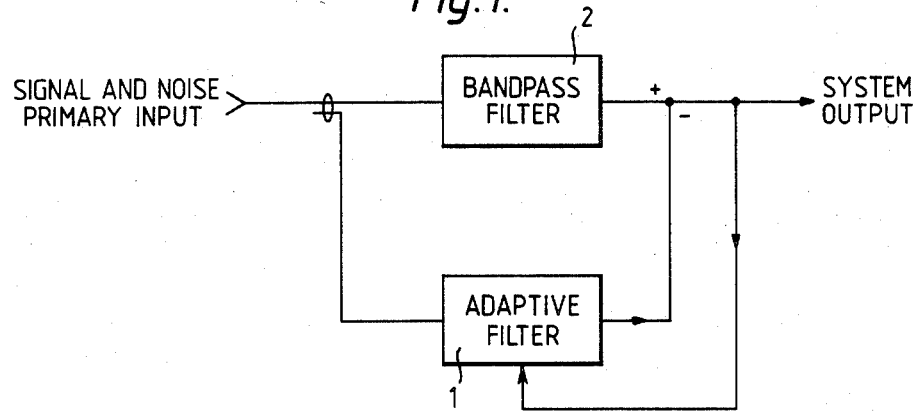
FIG. 1 illustrates schematically a constrained adaptive filter according to the present invention.

In a front end filter application as in FIG. 1, a suitable reference is an attenuated copy of the incoming signals. The adaptive filter 1 is arranged to provide no more than unity gain and it follows that no cancellation can occur at the point of subtraction.

If the interference in the primary input could be attenuated by as much or more than the reference then it could be cancelled. As "out of band" signals are the interference, a suitably chosen bandpass filter 2 will allow their cancellation without affecting "in band" signals.

The advantage of this method is that whilst a bandpass filter is still required, a sharp cut-off is no longer needed because the filter's purpose is only to identify "out of band" interference for the adaptive filter to cancel. The sharp cut-off is effectively provided by the notches, reducing the number of poles required.

Figure 2:
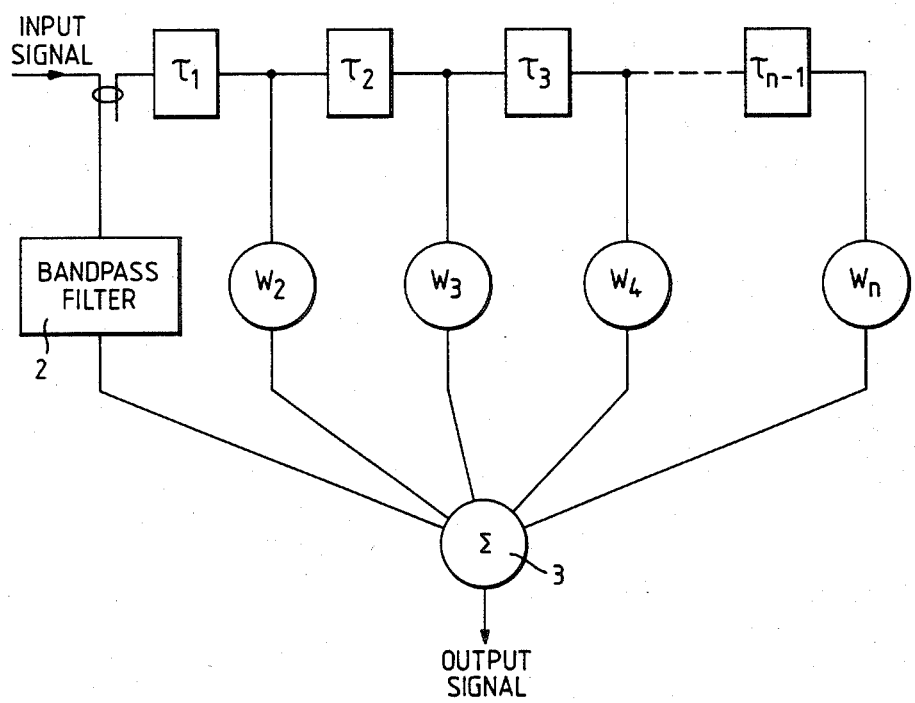
FIG. 2 illustrates more specifically a constrained adaptive filter according to the present invention.
Figure 3:
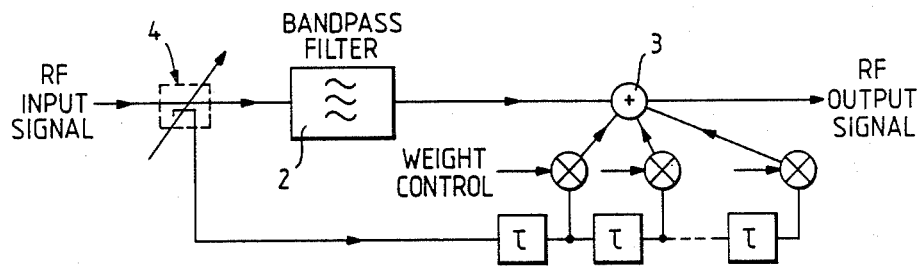
FIG. 3 illustrates an alternative way of drawings the constrained adaptive filter circuitry of FIG. 2.

The adaptive filter of FIG. 1 may be configured as a transversal filter with variable weights at the taps, see FIG. 2 which shows an n tap transversal filter with passband protection i.e. a constrained adaptive filter. A basic version of such a filter may be drawn as illustrated in FIG. 3. The delays $\tau_1$ to $\tau_{n-1}$ provide a phase gradient at the taps, weights $W_2$ to $W_n$, which affect amplitude and phase, can control the frequencies at which destructive interference takes place. Each tap and associated weight provide a tunable notch. The delays are required because, mathematically, two weights in parallel could be replaced by one, and a delay between the taps ensures that the phase at each tap is a different function of frequency.

The signal at the summing point 3 in FIG. 2 or FIG. 3 represents the error between the adapted reference and the main signal path. The filter is made adaptive by creating a control loop to minimise the error by controlling the weights accordingly, this is conventional and is achieved by means of a suitable control algorthm.

Thus by adding a fixed (non-adaptive) filter to the normal adaptive notch filter, nulls are only allowed to be formed in the skirt region of the fixed filter response, that is the spectral location of the nulls is constrained. This is illustrated in FIG. 4 which shows a typical transfer function of a constrained adaptive filter according to the present invention.

Figure 4:
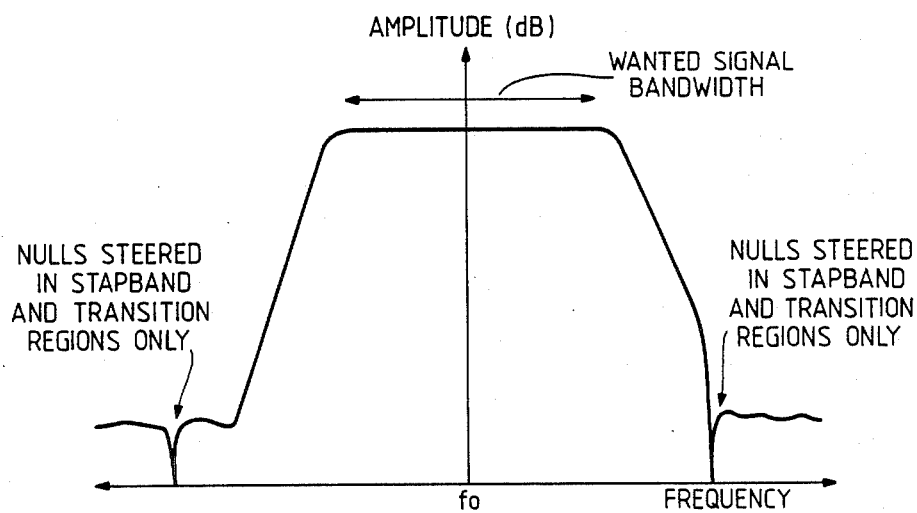
FIG. 4 illustrates a typical transfer function of a constrained adaptive filter according to the present invention.

The coupler 4 can be adjustable as shown in FIG. 4. The value of coupling will then be adjustable and will determine the extent to which nulls can approach the wanted signal frequency.

I claim:

1. A constrained adaptive filter which prevents the formation of nulls at a frequency of interest comprising:
   a signal input;
   a signal output;
   a main signal path connected to said signal input;
   a non-adaptive filter having an output, the non-adaptive filter having a passband including the frequency of interest and the non-adaptive filter being connected in the main signal path;
   a secondary signal path coupled to said signal input, the secondary signal path including a tapped delay line;
   means for weighting outputs of the tapped delay line;
   summing means to which the weighted outputs of the tapped delay line and the non-adaptive filter output are applied,
   the summing means having an output connected to said signal output; and
   a control loop coupled between said signal output and the weighting means to control weights applied to said weighting means to the outputs of the tapped delay line whereby to form nulls at interference frequencies outside of said passband.

2. A constrained adaptive filter as claimed in claim 1 wherein the non-adaptive filter allows the formation of nulls only in a skirt region of the non-adaptive filter's response.

3. A constrained adaptive filter as claimed in claim 1, wherein the secondary signal path is coupled to the main signal path and thence to said signal input via a coupler having an adjustable amount of coupling.

* * * * *